(12) United States Patent
Mohamadi

(10) Patent No.: US 7,312,763 B2
(45) Date of Patent: *Dec. 25, 2007

(54) WAFER SCALE BEAM FORMING ANTENNA MODULE WITH DISTRIBUTED AMPLIFICATION

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 73 days.

This patent is subject to a terminal disclaimer.

(21) Appl. No.: 11/141,283

(22) Filed: May 31, 2005

(65) Prior Publication Data

US 2006/0077102 A1 Apr. 13, 2006

Related U.S. Application Data

(60) Provisional application No. 60/590,698, filed on Jul. 23, 2004.

(51) Int. Cl.
*H01Q 21/00* (2006.01)
(52) U.S. Cl. .............................. 343/853; 343/700 MS; 343/700; 333/103; 333/161
(58) Field of Classification Search ................ 333/103, 333/104, 161, 164; 343/700 MS, 853, 700
See application file for complete search history.

(56) References Cited

U.S. PATENT DOCUMENTS 4,635,062 A * 1/1987 Bierig et al. ................ 342/372
5,905,466 A * 5/1999 Jha ....................... 343/700 MS
6,008,776 A * 12/1999 Yarbrough et al. .......... 343/853
2005/0135724 A1* 6/2005 Helvajian et al. ............. 385/14
2006/0284783 A1* 12/2006 Mohamadi ................... 343/853

OTHER PUBLICATIONS

F. Mohamadi, "Effect of Scaling Of Interconnections on the Time Delay of FLSI Circuits", IEEE Transactions on Electron Devices, Vol. ED-29, No. 4, Apr. 1982, pp. 645-650.
F. Mohamadi, "Si Intergration With Millimeter Wave Phased Array Antenna", RF Design, Feb. 2004, pp. 40-48.
F. Mohamadi, "Data Timing is Critical in Distributed Systems", RF Design, May 2004, pp. 13-20.
Xiang Guan et al., "A 24GHz CMOS Front-end", Dept. Electrical Eng., Calif. Institute of Tech., no date provided.
Xiang Guan et al., "A Fully Integrated 24-GHz Eight-Element Phased-Array Receiver in Silicon", IEEE Journal of Solid-State Circuits, Vol. 39, No. 12, Dec. 2004, pp. 2311-2320.
B. Kleveland et al., "Exploiting CMOS Reverse Interconnect Scaling in Multigigahertz . . . ", IEEE Journal of Solid-State Circuits, vol. 36, No. 10, Oct. 2001, pp. 1480-1448.

* cited by examiner

*Primary Examiner*—Tho Phan
(74) *Attorney, Agent, or Firm*—Jonathan W. Hallman; MacPherson Kwok Chen & Heid LLP

(57) ABSTRACT

In one embodiment, a wafer scale antenna array is provided that includes: a substrate, a first plurality of antennas adjacent to the substrate; and a driving network adjacent the substrate for transmitting RF signals to the plurality of antennas and for receiving RF signals from the plurality of antennas, the driving network coupling to a distributed plurality of driving amplifiers and corresponding matching amplifiers integrated with the substrate.

11 Claims, 14 Drawing Sheets

WAFER SCALE BEAM FORMING ANTENNA MODULE WITH DISTRIBUTED AMPLIFICATION

RELATED APPLICATIONS

This application claims the benefit of U.S. Provisional No. 60/590,698, filed Jul. 23, 2004, the contents of which are hereby incorporated by reference in their entirety.

TECHNICAL FIELD

The present invention relates generally to antennas, and more particularly to a wafer scale beam forming antenna array having distributed amplification.

BACKGROUND

Conventional high-frequency antennas are often cumbersome to manufacture. In particular, conventional beam forming antenna arrays require complicated feed structures and phase-shifters that are impractical to be implemented in a semiconductor-based design due to its cost, power consumption and deficiency in electrical characteristics such as insertion loss and quantization noise levels. In addition, such beam forming arrays become incompatible with digital signal processing techniques as the operating frequency is increased. For example, at the higher data rates enabled by high frequency operation, multipath fading and cross-interference becomes a serious issue. Adaptive beam forming techniques are known to combat these problems. But adaptive beam forming for transmission at 10 GHz or higher frequencies requires massively parallel utilization of A/D and D/A converters.

To address the need in the art for improved beam forming antenna arrays, the present inventor disclosed beam forming antenna arrays compatible with wafer scale integration in copending U.S. application Ser. No. 11/074,027, filed Mar. 7, 2005, now U.S. Pat. No. 7,126,542, and U.S. application Ser. No. 11/049,098, filed Feb. 2, 2005, now U.S. Pat. No. 7,126,541, the contents of both of which are hereby incorporated by reference. These applications utilized and expanded upon the beam forming capabilities disclosed by the present inventor in copending U.S. application Ser. No. 10/423,303, filed Apr. 25, 2003, now U.S. Pat. No. 6,885,344, U.S. application Ser. No. 10/423,160, filed Apr. 25, 2003, now U.S. Pat. No. 6,870,503, U.S. application Ser. Nos. 10/422,907, filed Apr. 25, 2003, 10/423,129, filed Apr. 25, 2003, now U.S. Pat. No. 6,963,307, 10/860,526, filed Jun. 3, 2004, now U.S. Pat. No. 6,982,670, and 10/942,383, filed Sep. 16, 2004, the contents of all of which are hereby incorporated by reference in their entirety.

One embodiment of a beam forming antenna system described in the above-mentioned applications is shown in FIG. 1, which illustrates an integrated RF beam forming and controller unit 130. In this embodiment, the receive and transmit antenna arrays are the same such that each antenna 170 functions to both transmit and receive. A plurality of integrated antenna circuits 125 each includes an RF beam forming interface circuit 160 and receive/transmit antenna 170. RF beam forming interface circuit 160 adjusts the phase and/or the amplitude of the received and transmitted RF signal responsive to control from a controller/phase manager circuit 190. Although illustrated having a one-to-one relationship between beam forming interface circuits 160 and antennas 170, it will be appreciated, however, that an integrated antenna circuit 125 may include a plurality of antennas all driven by RF beam forming interface circuit 160.

A circuit diagram for an exemplary embodiment of RF beam forming interface circuit 160 is shown in FIG. 2. Note that the beam forming performed by beam forming circuits 160 may be performed using either phase shifting, amplitude variation, or a combination of both phase shifting and amplitude variation. Accordingly, RF beam forming interface circuit 160 is shown including both a variable phase shifter 200 and a variable attenuator 205. It will be appreciated, however, that the inclusion of either phase shifter 200 or attenuator 205 will depend upon the type of beam forming being performed. To provide a compact design, RF beam forming circuit may include RF switches/multiplexers 210, 215, 220, and 225 so that phase shifter 200 and attenuator 205 may be used in either a receive or transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The resulting shifted signal routes through RF switch 225 to RF switch 210. RF switch 210 then routes the signal to IF processing circuitry (not illustrated).

In a transmit configuration, the RF signal received from IF processing circuitry (alternatively, a direct down-conversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beam forming interface circuit 160 may be constructed not including switches 210, 220, and 225 such that the receive and transmit paths do not share phase shifter 200 and/or attenuator 205. In such embodiments, RF beam forming interface circuit 160 would include separate phase-shifters and/or attenuators for the receive and transmit paths.

To assist the beam forming capability, a power detector 250 functions as a received signal strength indicator to measure the power in the received RF signal. For example, power detector 250 may comprise a calibrated envelope detector. Power manager 150 (FIG. 1) may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beam forming direction may simply be commanded by controller/phase manager 190 rather than derived from a received signal. In such embodiment, power manager 150 and power detectors 250 need not be included since phasing information will not be derived from a received RF signal.

Regardless of whether integrated antenna circuits 125 perform their beam forming using phase shifting and/or amplitude variation, the shifting and/or variation is performed on the RF signal received either from the IF stage (in a transmit mode) or from its antenna 170 (in a receive mode). By performing the beam forming directly in the RF domain as discussed with respect to FIGS. 1 and 2, substantial savings are introduced over a system that performs its beam forming in the IF or baseband domain. Such IF or baseband systems must include A/D converters for each RF channel being processed. In contrast, the system shown in FIG. 1 may supply a combined RF signal from an adder 140. From an IF standpoint, it is just processing a single RF channel for the system of FIG. 1, thereby requiring just a single A/D. Accordingly, the following discussion will assume that the beam forming is performed in the RF domain. The injection of phase and/or attenuation control signals by controller/phase manager circuit 190 into each integrated antenna circuit 125 may be performed inductively as discussed in U.S. Pat. No. 6,963,307.

Examination of FIG. 1 shows that a network is necessary for the distribution of the RF signals to and from the IF stage to integrated antenna units 125 as well as to and from RF beam forming interface circuits 160 and their corresponding antenna(s) 170. U.S. Pat. No. 7,126,542 discloses a micro-waveguide network for distributing these RF signals. Because of the waveguide transmission, very low transmissions losses were thereby introduced into the distributed RF signals. Moreover, the micro-waveguide network was compatible with wafer scale integration of the resulting beam forming array.

Turning now to FIG. 3, a three-layer wafer scale integrated antenna module (WSAM) 300 is shown in cross-section. WSAM 300 includes a semiconductor substrate 301. On a first surface 302 of substrate 301, antennas such as patches 305 for the integrated antenna circuits are formed as discussed, for example, in U.S. Pat. No. 6,870,503. Active circuitry 310 for the corresponding integrated antenna circuits that incorporate these antennas on formed on a second surface 303 of substrate 301. Thus, WSAM 300 includes the "back side" feature disclosed in U.S. application Ser. No. 10/942,383 in that active circuitry 310 and antennas 305 are separated on either side of substrate 301. In this fashion, electrical isolation between the active circuitry and the antenna elements is enhanced. Moreover, the ability to couple signals to and from active circuitry 310 is also enhanced.

Adjacent to second surface 303 is a micro-waveguide distribution network 315. Network 315 carries the RF signals as discussed above. Thus, network 315 distributes the RF signal to and from the IF processing stage (or direct down-conversion stage depending upon the receiver architecture). In addition, network 315 may carry the RF signals to and from the RF beam forming interface circuits to their corresponding antenna(s).

Network 315 comprises waveguides that may be formed using metal layers in a semiconductor process such as CMOS as discussed in, for example, U.S. Pat. No. 6,870,503. However, it will be appreciated the waveguide diameter is then limited by maximum separation achievable between metal layers in such semiconductor processes. Typically, the maximum achievable waveguide diameter would thus be 7 microns or less, thereby limiting use of the waveguide to frequencies above 40 GHz. To accommodate lower frequency operation, micro-machined waveguides may also be utilized.

As discussed in U.S. Ser. No. 10/942,383, a heavily doped deep conductive junction 320 couples active circuitry 310 to vias/rods 330 that in turn couple to antenna elements 305. Formation of junctions 320 is similar to a deep diffusion junction process used for the manufacturing of double diffused CMOS (DMOS) or high voltage devices. It provides a region of low resistive signal path to minimize insertion loss to antenna elements 305.

Upon formation of junctions 320 in substrate 301, active circuitry 310 may be formed using standard semiconductor processes. Active circuitry 310 may then be passivated by applying a low temperature deposited porous SiOx and a thin layer of nitridized oxide (SixOyNz) as a final layer of passivation. Thickness of these sealing layers may range from a fraction of a micron to a few microns. Surface 303 may then be coated with a thermally conductive material and taped to a plastic adhesive holder to flip substrate 301 to expose surface 302. Substrate 301 may then be back ground to reduce its thickness to a few hundreds of micro-meters.

An electric shield 340 may then be sputtered or alternatively coated using conductive paints on surface 301. Shield 340 forms a reflective plane for directivity and also shields antenna elements 305. In addition, parts of shield 340 forms ohmic contacts to junctions 320. For example, metallic lumps may be deposited on junctions 320. These lumps ease penetration of via rods 330 to form ohmic contacts with active circuitry 310.

Network 315 may be formed in a glass, metallic, oxide, or plastic-based insulating layer/substrate 350. Depending upon the desired propagation frequency in network 315, the thickness of substrate 350 may range from a few millimeters to multiple tens of microns, A rectangular or circular cavity is then etched into substrate 350 to form a waveguide cavity 365. The walls of the cavity may then be metallically coated using silver, copper, aluminum, or gold to provide the waveguide boundaries. Each integrated antenna circuit (FIGS. 1-3) will need a feedline/receptor 370 as discussed, for example, in U.S. Pat. No. 7,126,541. Each feedline/receptor 370 may be formed from as a discrete metallic part having a base pin 375 that is inserted into a metallic lump to form ohmic contacts to active circuitry 310 analogous to the insertion of rods/vias 330. A metallic plate 360 may then be used to seal waveguide cavity 365 to complete micro-waveguide network 315. Because network 315 is metallic, it also may function as a heat sink for cooling active circuitry 310.

Although WSAM 300 advantageously suffers relatively very little loss in signal propagation through network 315, the antenna array capacity is impacted by the relative size necessary for each waveguide chamber 365. In general, such chambers need to be approximately ½ wavelength across as known in the waveguide arts. In turn, however, this minimum width requirement limits the number of antennas that may be integrated into a single wafer as each antenna would require (ultimately) its own waveguide.

Accordingly, there is a need in the art for improved wafer scale antenna modules that accommodate increased antenna array density.

SUMMARY

A wafer scale antenna array module has its RF feed network implemented using electrical interconnect through a microstrip, co-planar waveguide, or planar waveguide network rather than using electromagnetic propagation through, for example, a rectangular waveguide network. In this fashion, the pitch between individual electrical conductors in the RF feed network may be substantially reduced with respect to an electromagnetic propagation waveguide network. Because of this reduced pitch, the number of antenna elements that may be implemented onto a substrate is limited only by the substrate surface area, which may extend across an entire wafer is so desired.

In accordance with one aspect of the invention, an integrated circuit antenna array is provided that includes: a substrate, a first plurality of antennas adjacent the substrate; and a driving network adjacent the substrate for transmitting RF signals to the plurality of antennas and for receiving RF signals from the plurality of antennas, the driving network coupling to a distributed plurality of driving amplifiers and corresponding matching amplifiers integrated with the substrate.

The invention will be more fully understood upon consideration of the following detailed description, taken together with the accompanying drawings.

DETAILED DESCRIPTION

Figure 1:
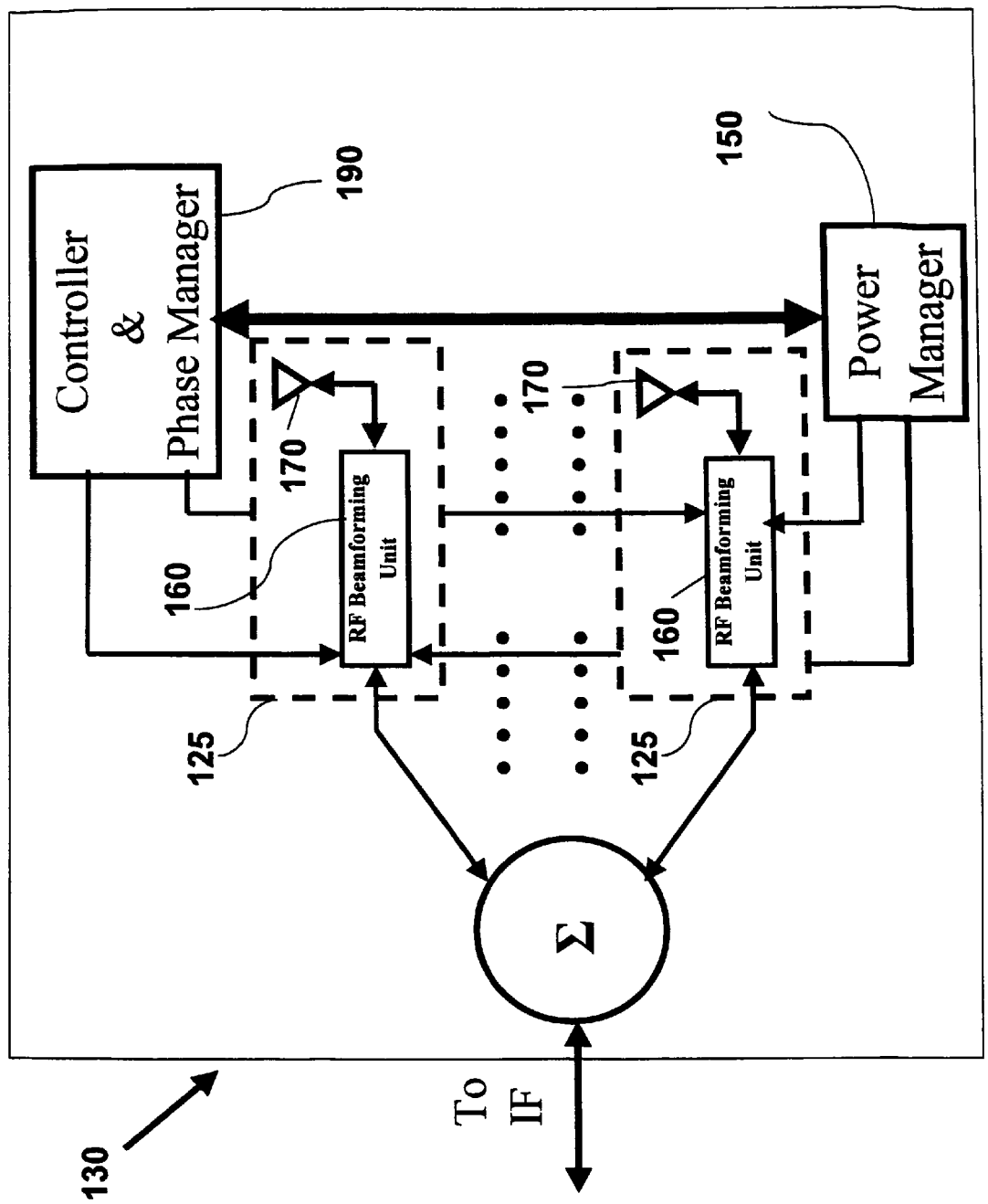
FIG. 1 is a block diagram of a beam forming antenna array in which the beam forming is performed in the RF domain.
Figure 2:
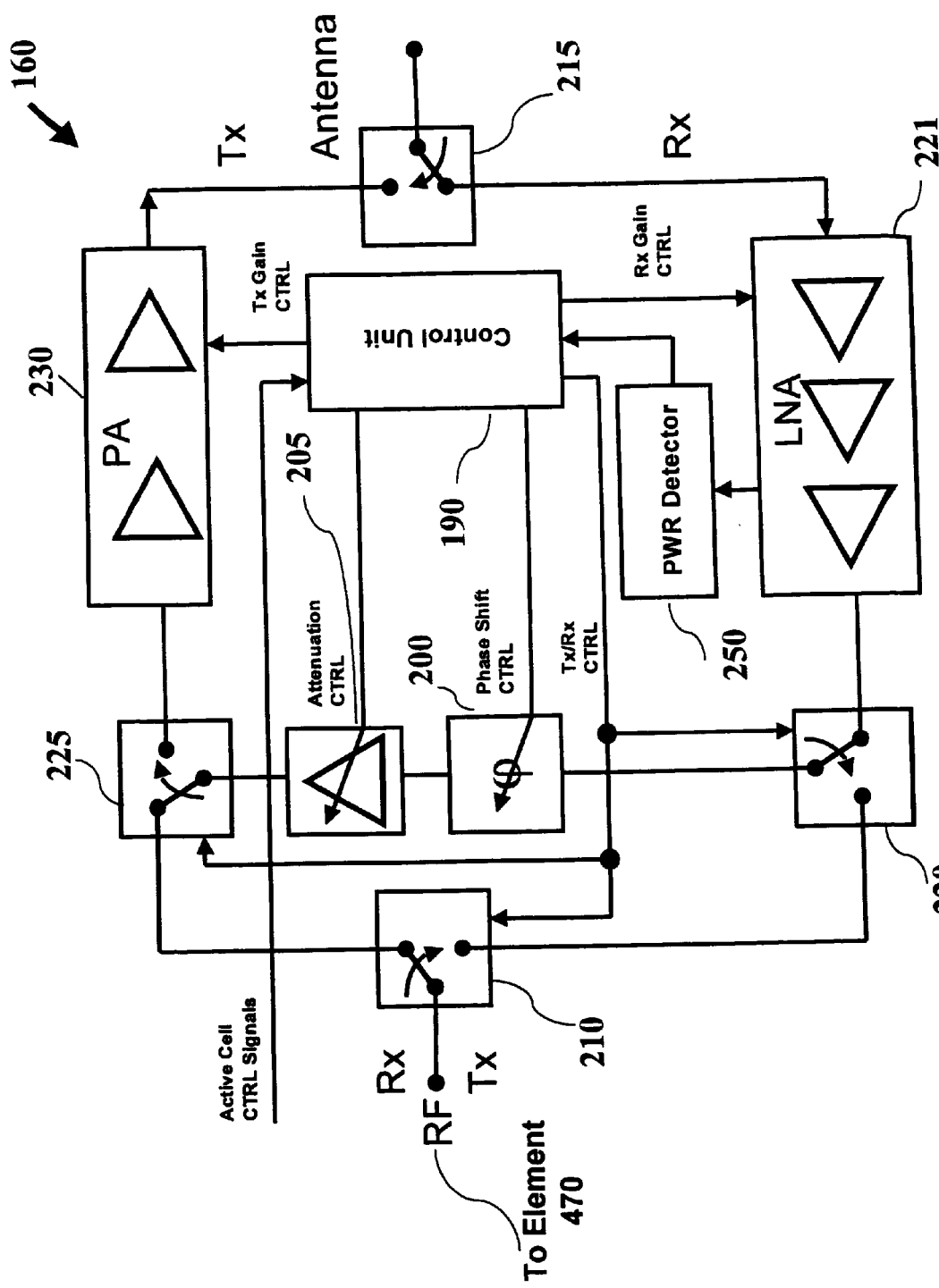
FIG. 2 is a schematic illustration of an RF beam forming interface circuit for the array of FIG. 1.
Figure 3:
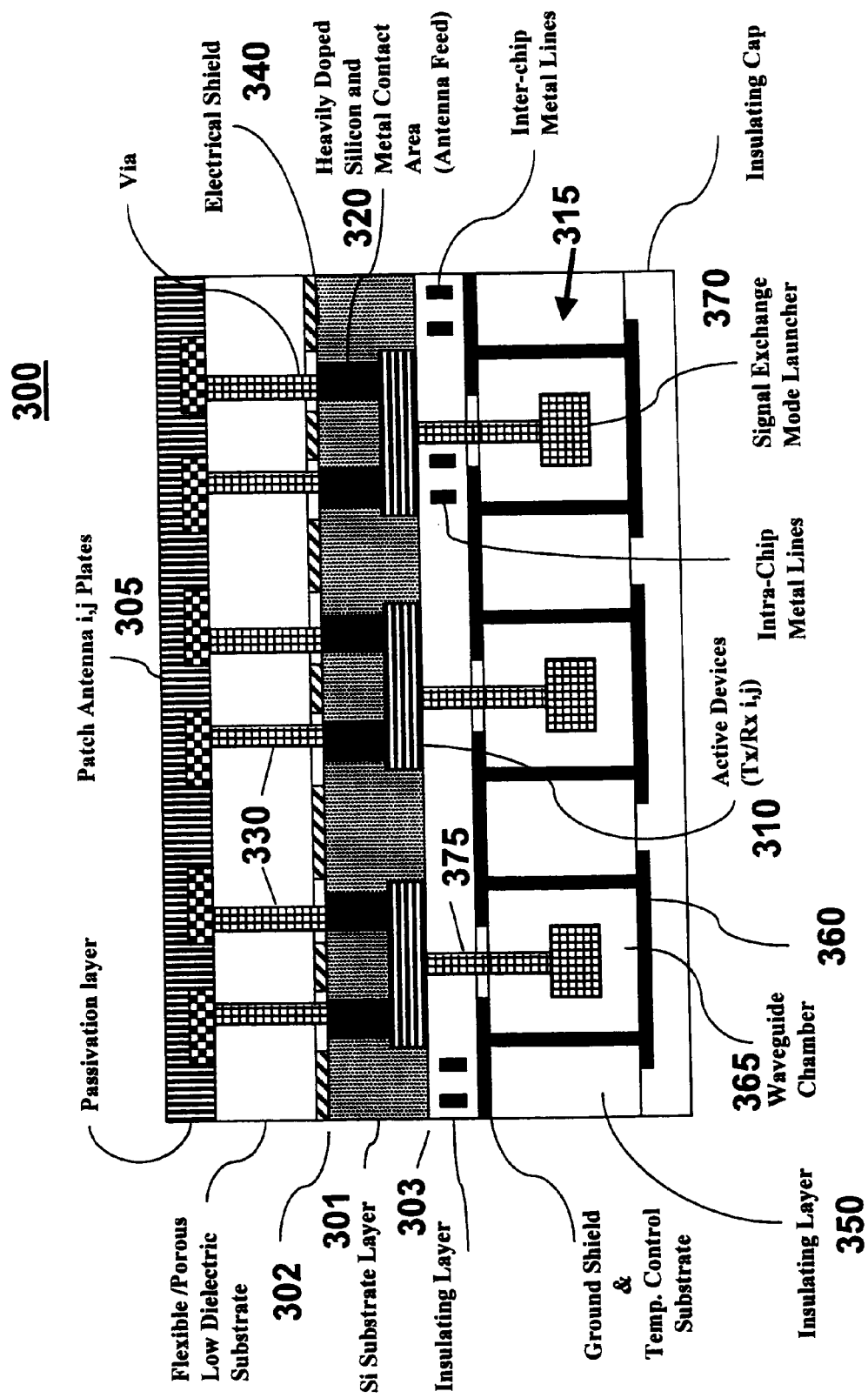
FIG. 3 is a cross-sectional view of a wafer scale antenna module having an RF feed network configured to use electromagnetic propagation rather than electrical conduction for transmission of RF signals.
Figure 4:
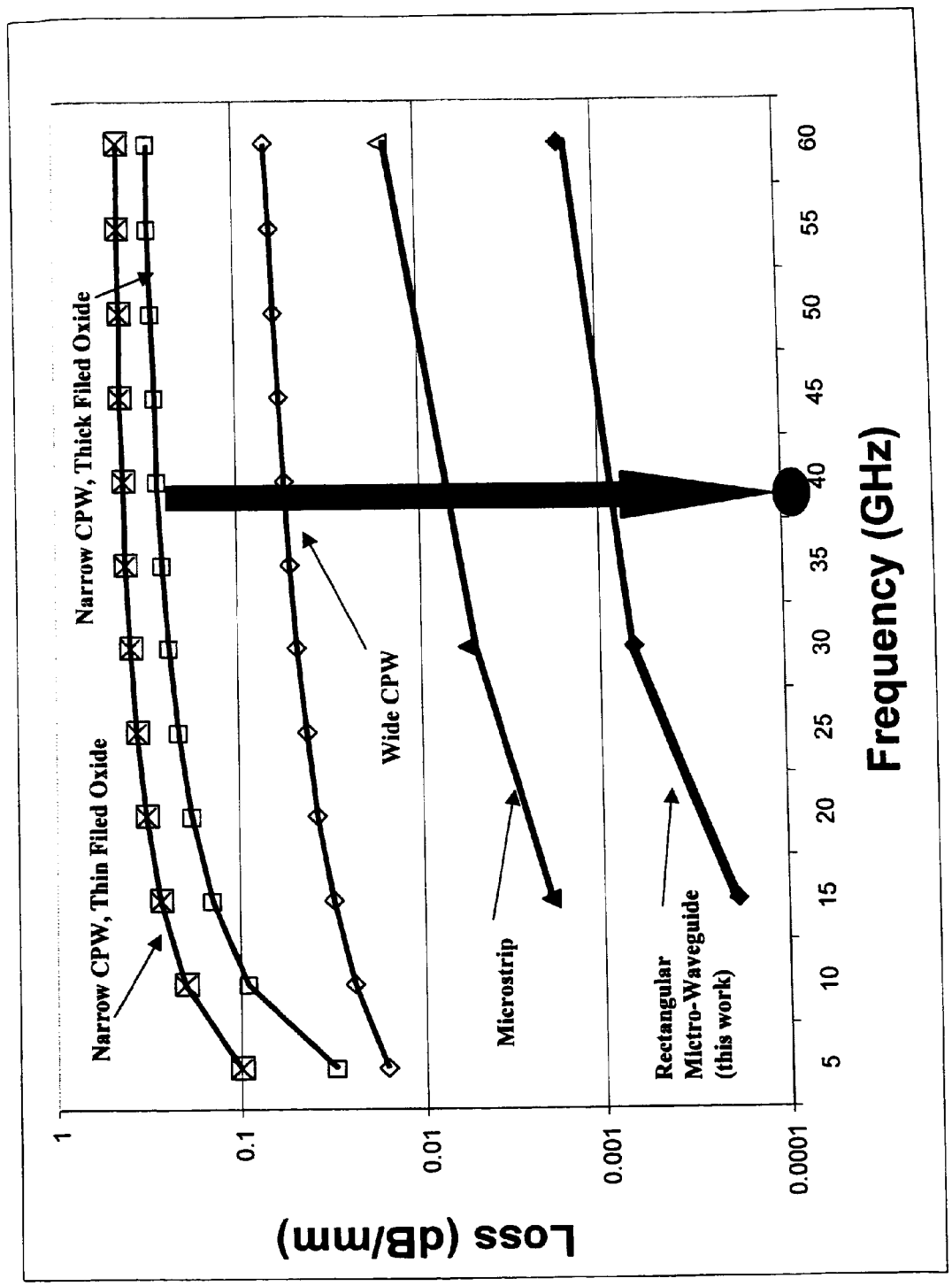
FIG. 4 illustrates the transmission losses as a function of frequency for a variety of waveguides.

To address the need in the art for wafer scale beam forming antenna arrays that have improved array density, the micro-waveguide network discussed with respect to FIG. 3 is replaced by a either a coplanar or microstrip waveguide network. In this fashion, the pitch between adjacent conductors in the network is substantially reduced. However, the accompanying transmission losses are thereby substantially increased. For example, FIG. 4 illustrates the loss in dB per mm of travel as a function of frequency for various co-planar waveguides, microstrip, and rectangular waveguides. Consider, for example, the losses at 40 GHz. A rectangular waveguide (such as waveguide 315 described above) has losses of less than 0.001 dB/mm. However, microstrip and coplanar waveguides (CPWs) have losses of approximately 10 to considerably more than 100 times greater. For example, a thin field CPW network has losses of above 0.1 dB/mm at this frequency. Because of the superior shielding properties of CPW over microstrip, the following discussion will assume without loss of generality that the RF feed network is implemented using CPW.

Figure 5:
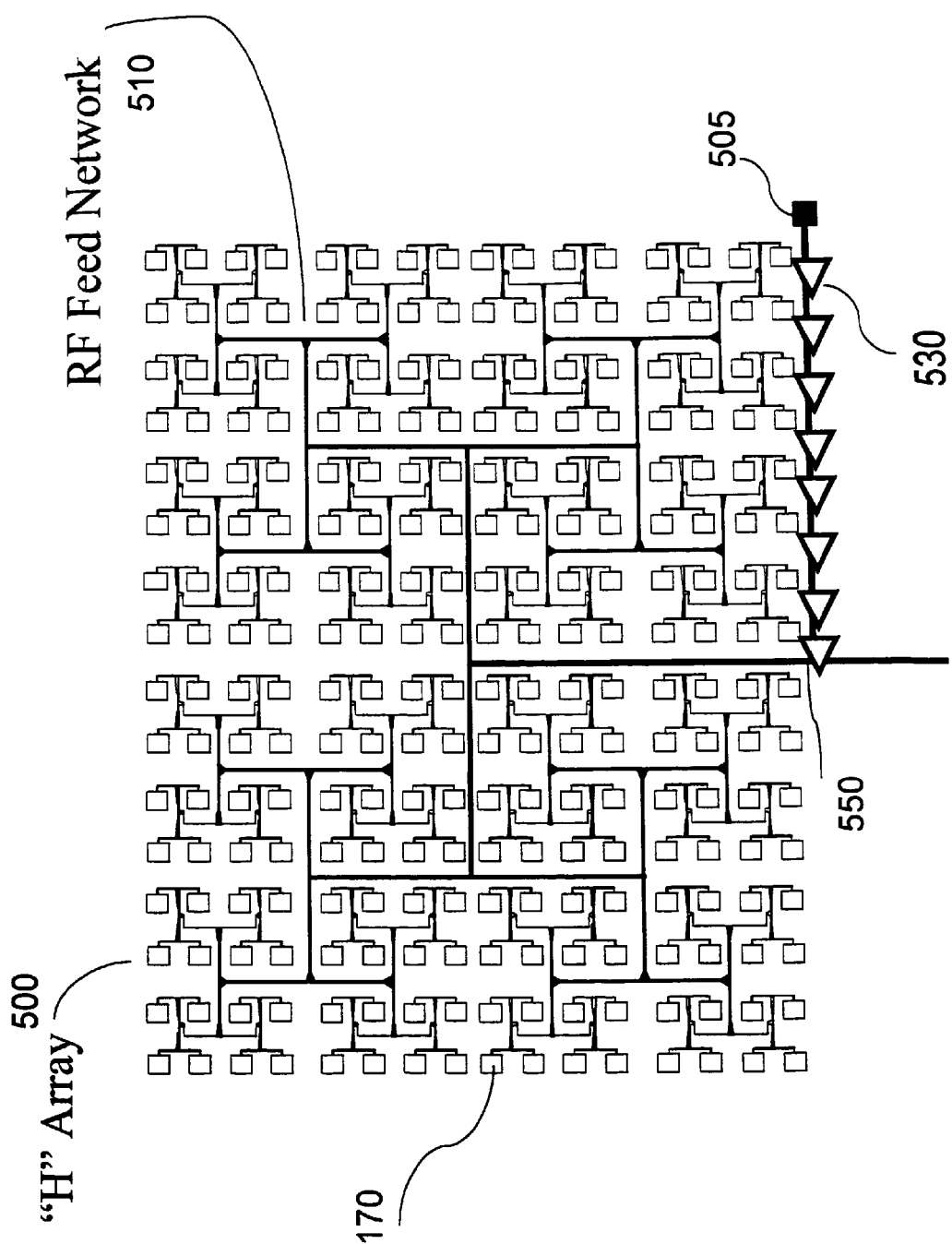
FIG. 5 is a plan view of a quadrant of a wafer scale beam forming antenna array module in accordance with an embodiment of the invention.

A view of the upper left quadrant of an 8" wafer scale antenna module 500 having 1024 antenna elements 170 is illustrated in FIG. 5. From a center feed point 505, a distribution network or RF feed network 510 couples to every antenna element 170. For such an array, the transmission distance from feed point 505 to any given antenna element is approximately 120 mm, which is close to 16 wavelengths at 40 Ghz. Should network 510 be implemented using CPW, the transmission losses can exceed −135 dB.

The present invention enables the use of such a lossy, yet advantageous for array density, network through the inclusion of distributed amplifiers. Referring back to FIG. 3, these distributed amplifiers are implemented analogously as discussed with respect to active circuitry 310. The rectangular network is replaced by either a coplanar waveguide network or a microstrip network in an analogous insulating layer adjacent the active circuitry. The antenna elements may be formed adjacent an opposing surface of the semiconductor substrate as discussed with respect to FIG. 3.

The network may be single-ended or differential. In one embodiment, the network may comprise a coplanar waveguide (CPW) having a conductor diameter of approximately 4 microns. With such a small diameter or pitch to the network, an array of 1024 antenna elements may be readily networked in an 8 inch wafer substrate. A driving amplifier in the network is followed by a matching amplifier for efficient performance. An exemplary embodiment of a BJT-based matching amplifier 600 is illustrated in FIG. 6a. Amplifier 600 couples to a coplanar waveguide network (not illustrated) at input port Vin and output port Vout. A first NPN BJT 605 has its collector coupled through an integrated inductor 610 to a supply voltage Vcc. This inductor may be formed using metal layers in a semiconductor process as discussed in See U.S. Pat. No. 6,963,307. Because such an integrated inductor will also have a stray capacitance and resistance, these stray effects are modeled by capacitor C1 and resistor R1. The metal layers in the semiconductor process may also be used to form DC blocking capacitor C3 and output capacitor $C_{out}$. The supply voltage also drives the base of BJT 605. BJT 605 has its emitter driving Vout as well as a collector of a second NPN BJT 620. A current source 630 such as a current-mirror configured transistor (not illustrated) biases the base of BJT 620 with a base current Ib. The emitter of BJT 620 couples to ground through an emitter inductor 640. Analogous to inductor 610, emitter inductor 640 has its stray capacitance and resistance modeled by capacitor C2 and resistor R2. It may be shown that an input resistance Rin for amplifier 600 is as follows:

$$R_{in} = (1/\beta) * L2/C_{be}$$

where β is the common emitter current gain for BJT 620, L2 is the inductance of the emitter inductor and Cbe is the base-emitter capacitance for BJT 620. Thus, BJT 620 and inductor 640 characterize the input impedance and may be readily designed to present a desired impedance. For example, if an Rin of 50 Ω is desired, BJT 620 emitter dimensions and inductor 640 may be designed accordingly.

Figure 7:
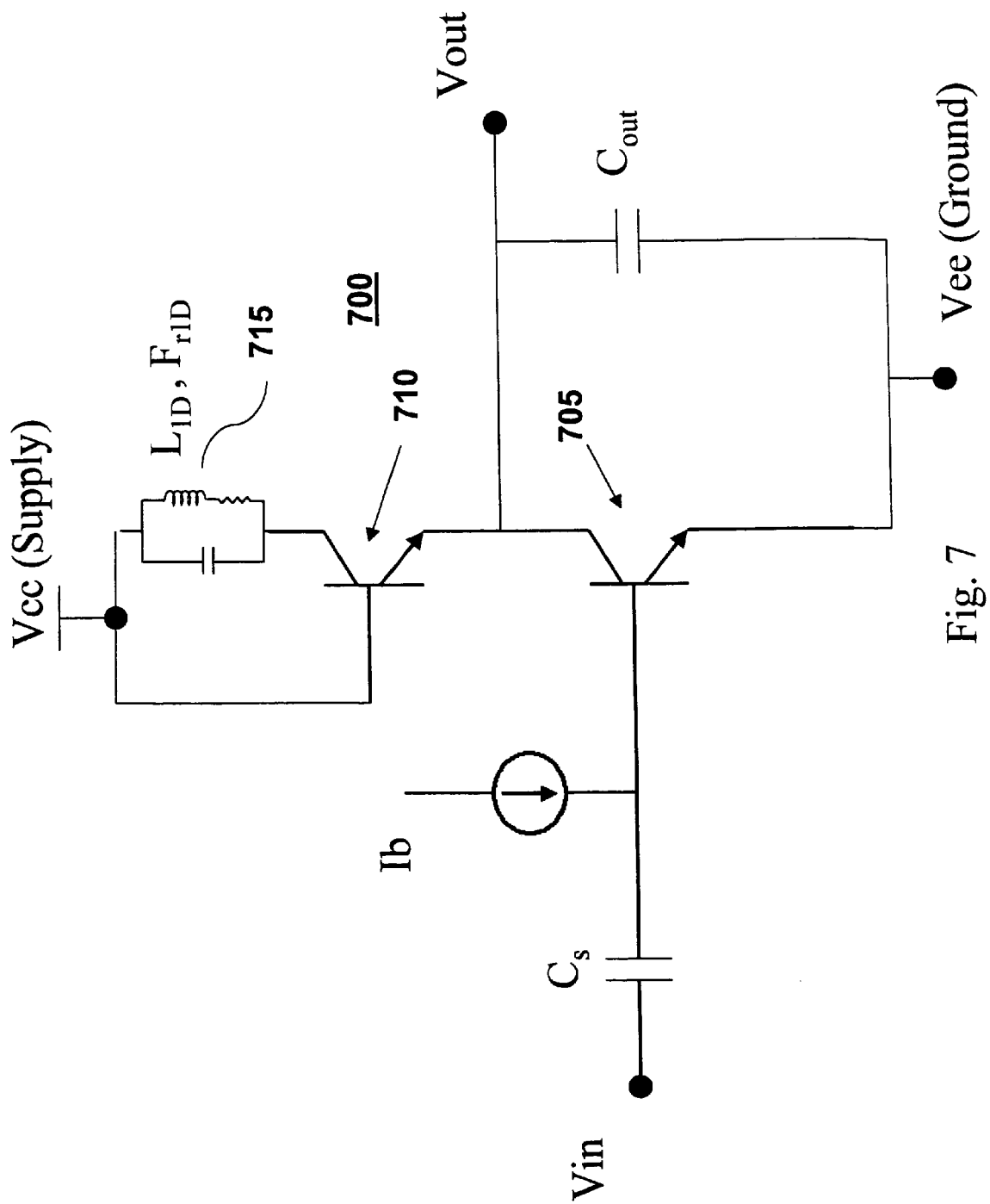
FIG. 7 is a schematic illustration of a driving amplifier in accordance with an embodiment of the invention.

An exemplary driving amplifier 700 is illustrated in FIG. 7. Driving amplifier 700 is constructed analogously to matching amplifier 600 except that no inductor loads the emitter of BJT 705. A BJT 710 has its collector loaded with an integrated inductor 715 analogously as discussed for BJT 605 of matching amplifier 600. Inductor 715 determines a center frequency Fd for driving amplifier 700 whereas both inductors 640 and 610 establish a resonant frequency Fm for matching amplifier 600. It may be shown that the band-pass center frequency Fc of a series-connected driving and matching amplifier is given as $$Fc = \frac{1}{2} * \sqrt{Fd^2 + Fm^2}$$

Figure 8:
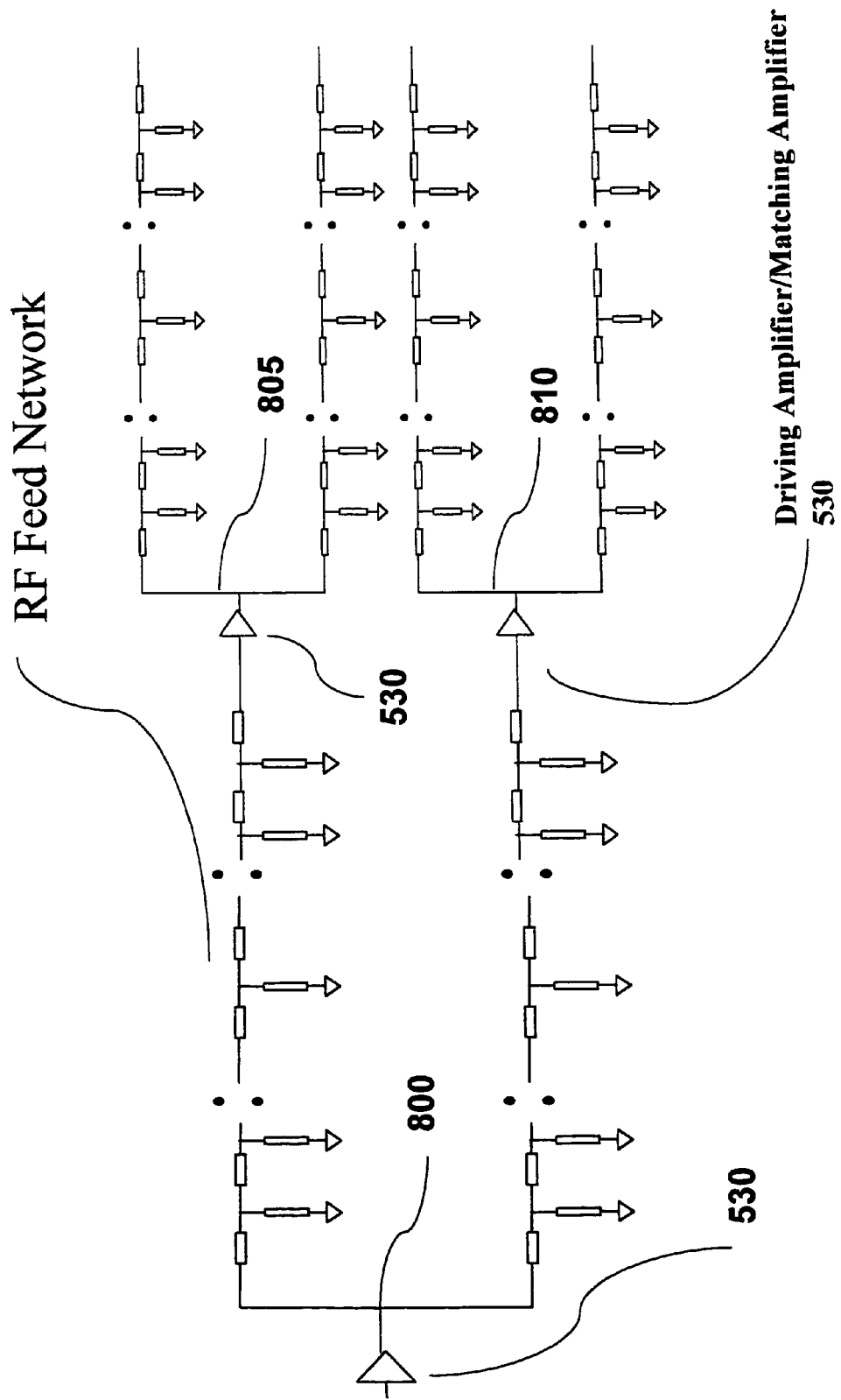
FIG. 8 illustrates a distributed amplification arrangement with respect to a splitting junction in accordance with an embodiment of the invention.
Figure 9:
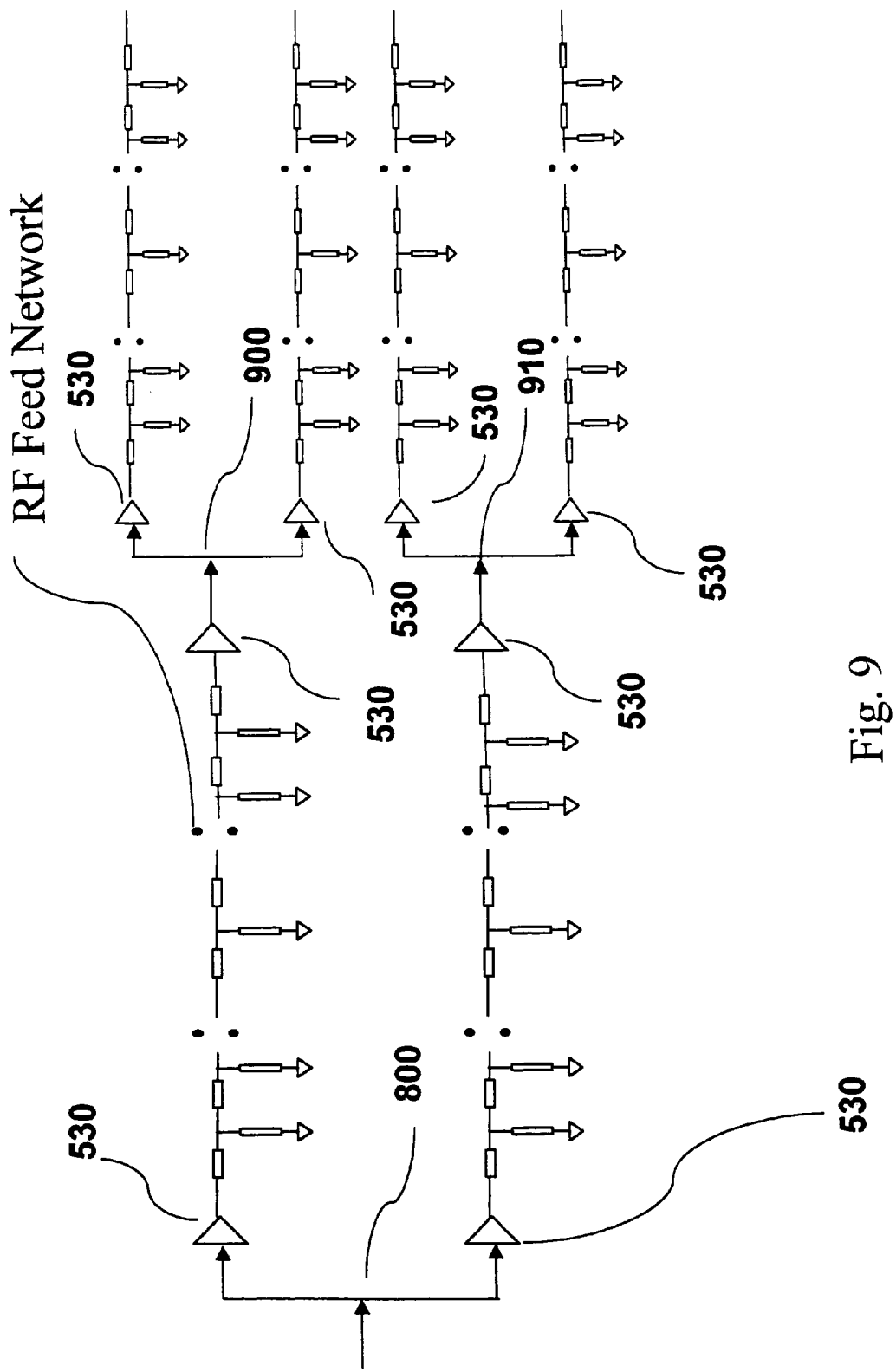
FIG. 9 illustrates a distributed amplification arrangement with respect to a splitting junction in accordance with an embodiment of the invention.

Referring back to FIG. 5, a series of driving amplifier/matching amplifier pairs 530 are shown coupling feed point 505 to first network intersection 550. In such an "H" configured network array, network 510 will continue to branch from intersection 550 such as at an intersection 560. Turning now to FIG. 8, a single driving amplifier/matching amplifier pair 530 may be used to drive both legs of network intersections 800, 805, and 810 in RF feed network 510. An alternative configuration is illustrated in FIG. 9 in which a driving amplifier/matching amplifier pair 530 both precedes and follows each network intersection 900 and 910 in RF feed network 510. It will be appreciated that the same considerations apply to a receiving (and hence combining) network. Indeed, the same network may be used for both transmission and reception in a half-duplex design. In a full duplex, separate transmit and receive RF feed networks should be used to avoid interference.

Figure 6:
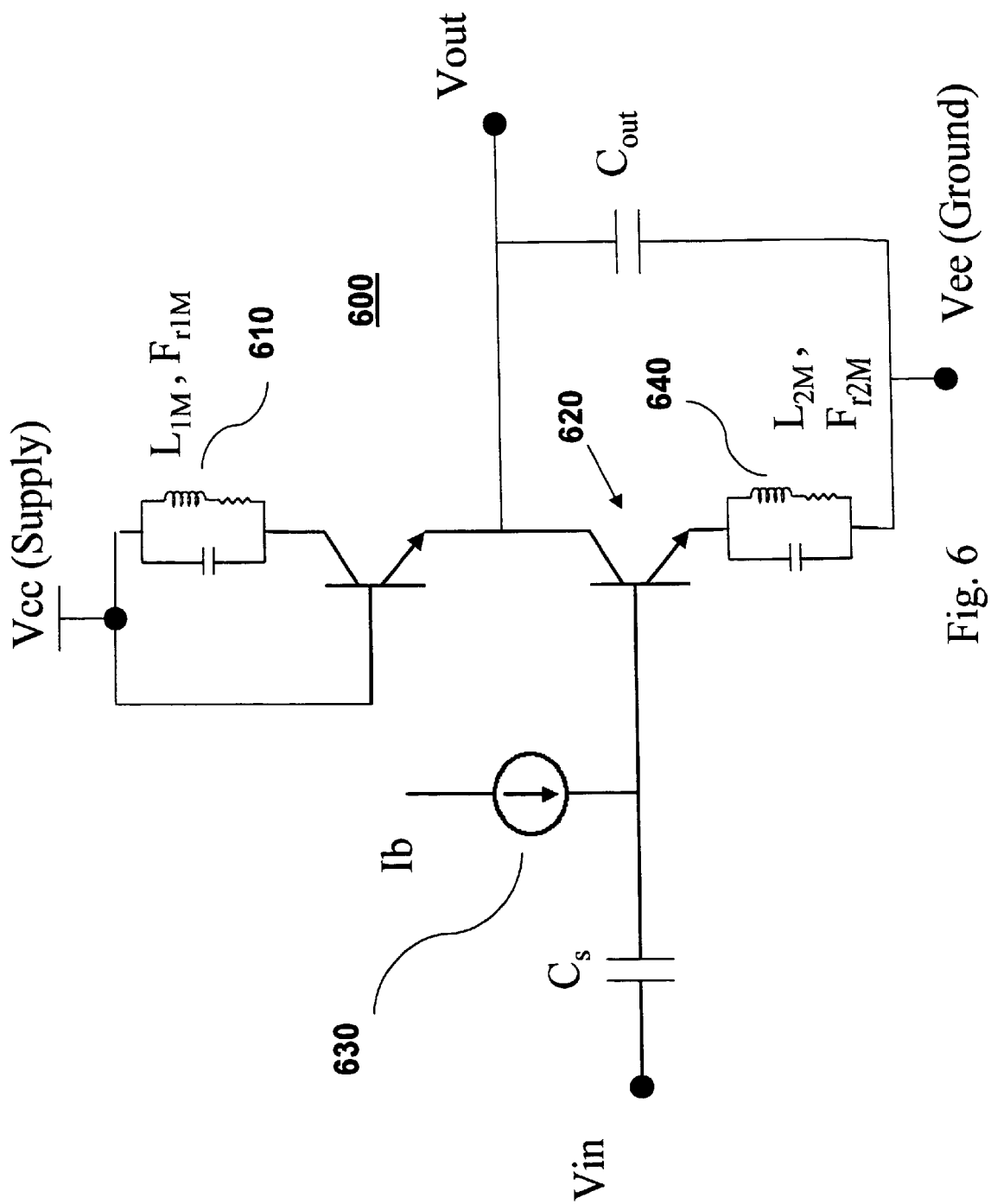
FIG. 6 is a schematic illustration of a matching amplifier in accordance with an embodiment of the invention.
Figure 10:
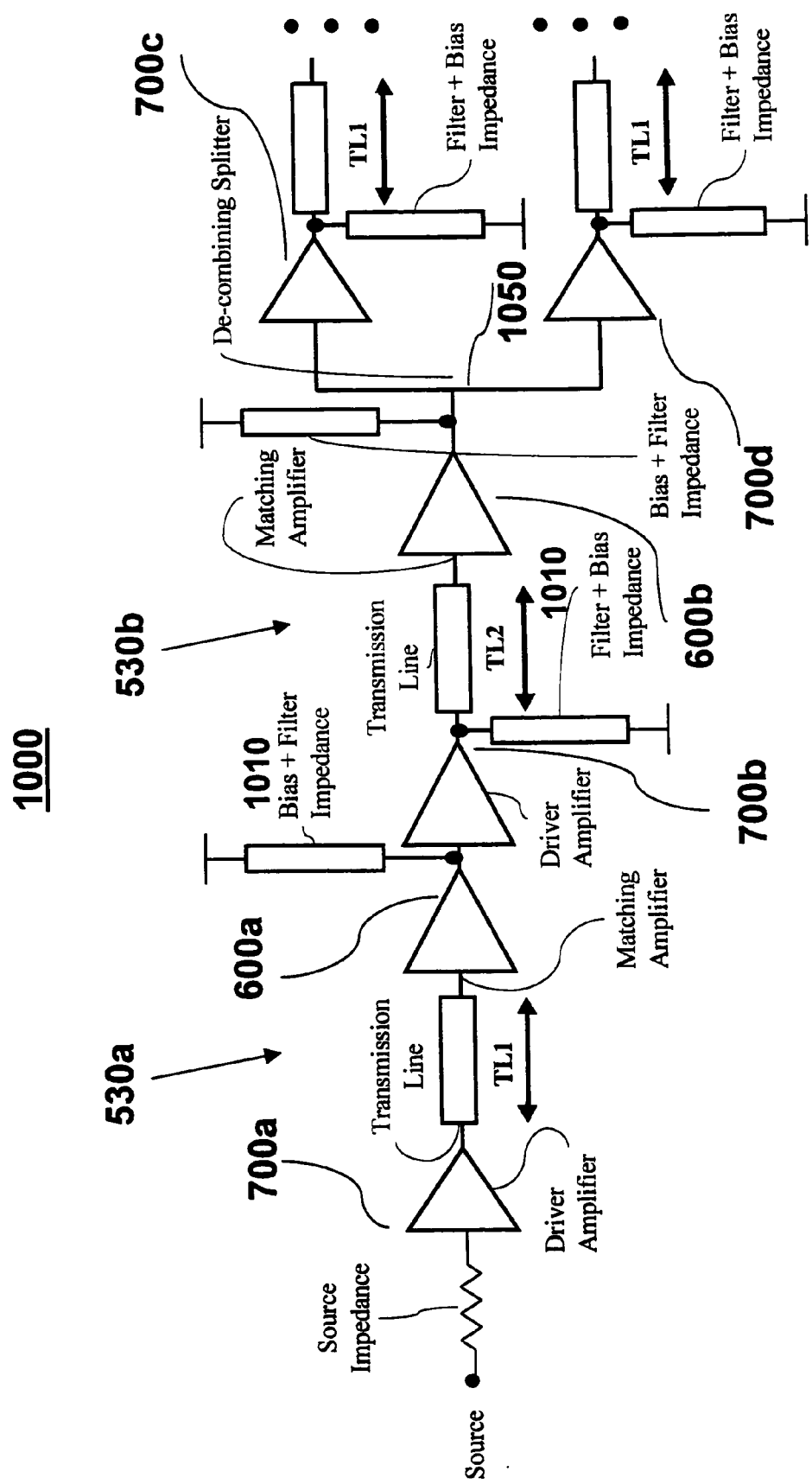
FIG. 10 illustrates a distributed amplification arrangement with respect to a splitting junction in accordance with an embodiment of the invention.

Network properties are influenced by the distance between driving amplifiers and matching amplifiers in successive driving amplifier/matching amplifier pairs. For example, as seen for RF network portion 1000 in FIG. 10, its input or source is received at a first driver amplifier 700*a*, which drives a matching amplifier 600*a* separated from driver 700*a* by a length of network transmission line (such as coplanar waveguide) of length TL1. Driver amplifier 700*a* and matching amplifier 600*a* thus constitute a first driving amplifier/matching amplifier pair 530*a*, which may also be denoted as a load balanced amplifier (LBA). Matching amplifier 600*a* is immediately followed by a driver amplifier 700*b*, which couples to the output of matching amplifier 600*a* directly in the active circuitry silicon rather than through a transmission line section. In this fashion, die space on the wafer substrate is conserved. However, it will be appreciated that an RF network CPW transmission line segment could also be used to couple matching amplifier 600*a* to driving amplifier 700*b*. Driver amplifier 700*b* drives a matching amplifier 600*b* separated from driver 700*b* by a length TL2 of network transmission line. Driver amplifier 700*b* and matching amplifier 600*b* thus form a second driving amplifier/matching amplifier 530*b*. The necessary biasing and inductance loading as described with respect to FIGS. 6 and 7 are represented by bias and filter impedances 1010. In general, the sum of TL1 and TL2 should equal one half of the center frequency wavelength. By changing the ratio of TL1/TL2 and the output capacitance, a maximum stable gain of approximately 20 to 30 dB may be obtained for 35 GHz operation. Stable gain and frequency performance may be seen for a capacitance load of 50 fF as TL1/TL2 is varied from 40% to 80%.

In prior art RF distribution networks, splitting and combining signals was problematic and involved cumbersome combiner or splitter circuitry. However, note the simplicity involved for the coupling of matching amplifier 600*b* through splitting junction 1050 to driver amplifiers 700*c* and 700*d*. This coupling occurs through a node in the active circuitry substrate to conserve wafer substrate area. However, this substrate coupling may be replaced by a CPW transmission line segment in alternative embodiments. As compared to prior art splitters, not only is there no loss coupling through splitting junction 1050, but there is a gain instead. Moreover, transmission through the RF feed network is low loss and low noise because the driver and matching amplifiers are tuned with reactive components only—no resistive tuning (and hence loss) need be implemented.

Figure 11:
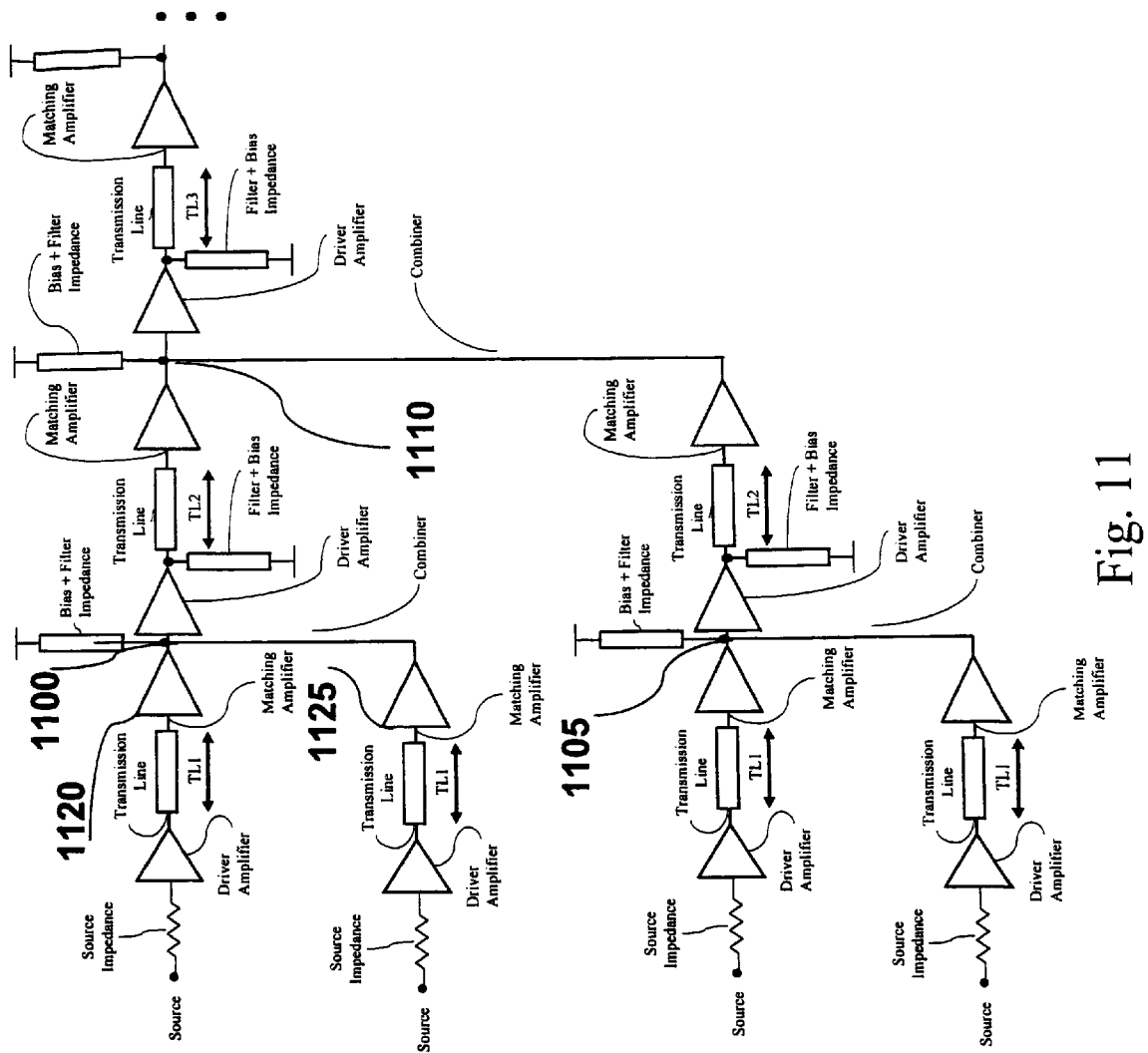
FIG. 11 illustrates a distributed amplification arrangement with respect to a combining junction in accordance with an embodiment of the invention.
Figure 12:
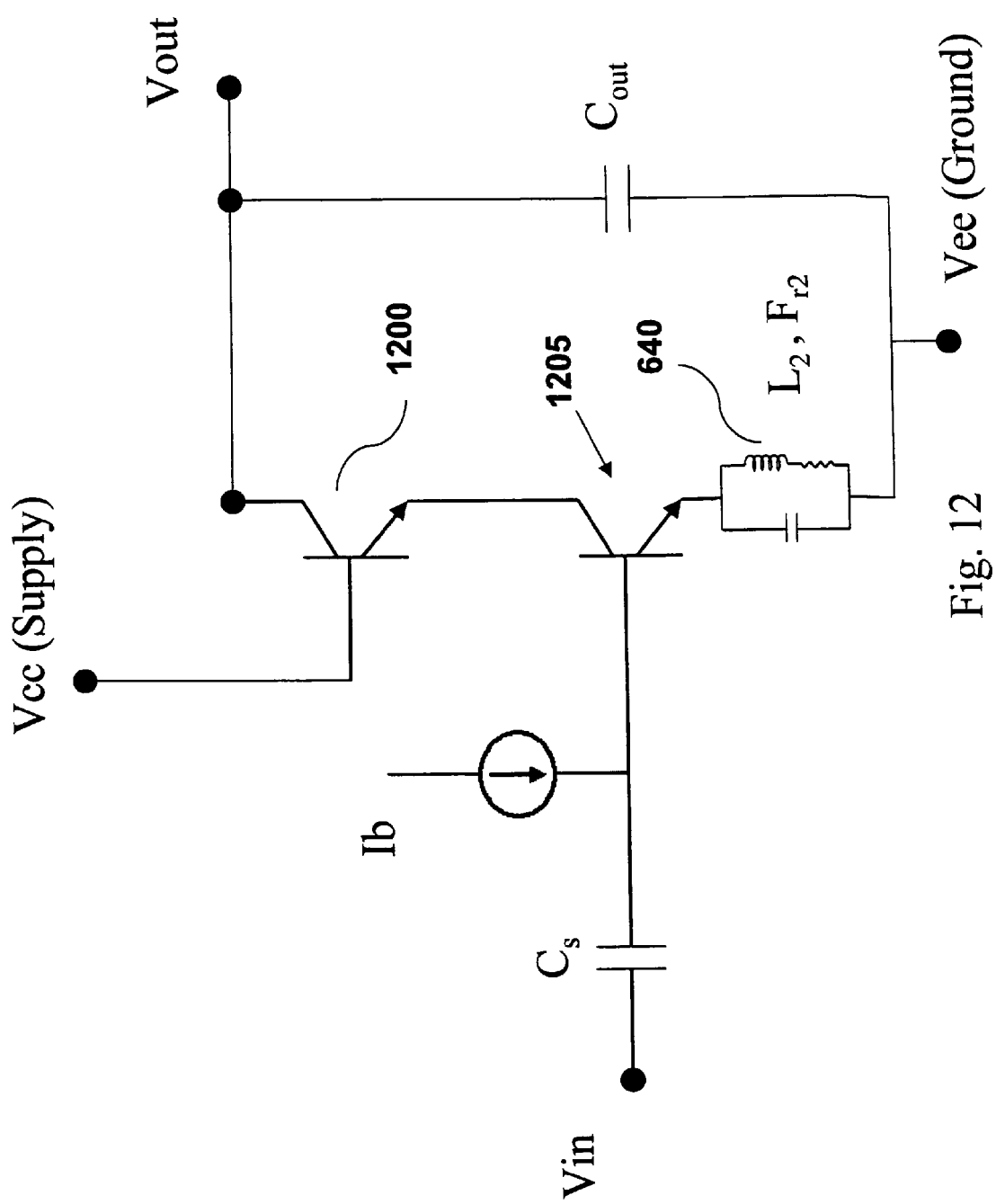
FIG. 12 is a schematic illustration of a combiner matching amplifier having a common collector terminal in accordance with an embodiment of the invention.

The same low loss and simplicity of design advantages are present with respect to combining junction 1100, 1105, and 1110 as seen in FIG. 11. For example, with respect to junction 1100, two combiner matching amplifiers 1120 and 1125 couple through a node in the active circuitry substrate to a driving amplifier 700*e* to conserve wafer substrate area. However, it will be appreciated that a CPW transmission line segment may be used to perform this coupling in alternative embodiments. Bias and filter impedance 1010 is thus shared by both combiner matching amplifiers. Turning now to FIG. 12, a combiner matching amplifier is distinguished from a non-combiner matching amplifier such as discussed with respect to FIG. 6 by the open collector of BJT 1200, which provides Vout. Output capacitor $C_{out}$ thus loads the open collector. BJT 1205 has its emitter loaded by the matching inductor 640 for impedance matching as discussed with respect to FIG. 6. A common load inductor (not illustrated) couples to output node Vout to uniformly load all the involved combiner matching amplifiers.

The CPW RF feed network with distributed amplifiers may be integrated onto the "backside" of the substrate as discussed with respect to rectangular waveguide network 315. Alternatively, the CPW network may be integrated on the antenna side of the substrate. Because the backside approach has the isolation and coupling advantages described earlier with respect to FIG. 3, the following discussion will assume without loss of generality that the RF feed network is integrated with the substrate in a backside embodiment. For example as seen in cross-section in FIG. 13, a semiconductor substrate 301 has surfaces 302 and 302. Antenna elements 305 are formed adjacent surface 302 as discussed with respect to FIG. 3. Active circuitry 1310 integrated with substrate 301 includes, however, the driving and matching amplifiers for an RF feed network 1305 having CPW conductors S1 and S2. Adjacent surface 303, metal layer M1 includes inter-chip and other signal lines. Metal layer M2 forms a ground plane for CPW conductors S1 and S2, which are formed in metal layer 5 as well as ground plates 1320. Metal layer M4 provides a connecting layer to couple CPW conductors together as necessary. The driving and matching amplifiers within active circuitry 1310 couple through vias (not illustrated) in apertures in the ground plane in metal layer M2 to CPW conductors S1 and S2.

Figure 13:
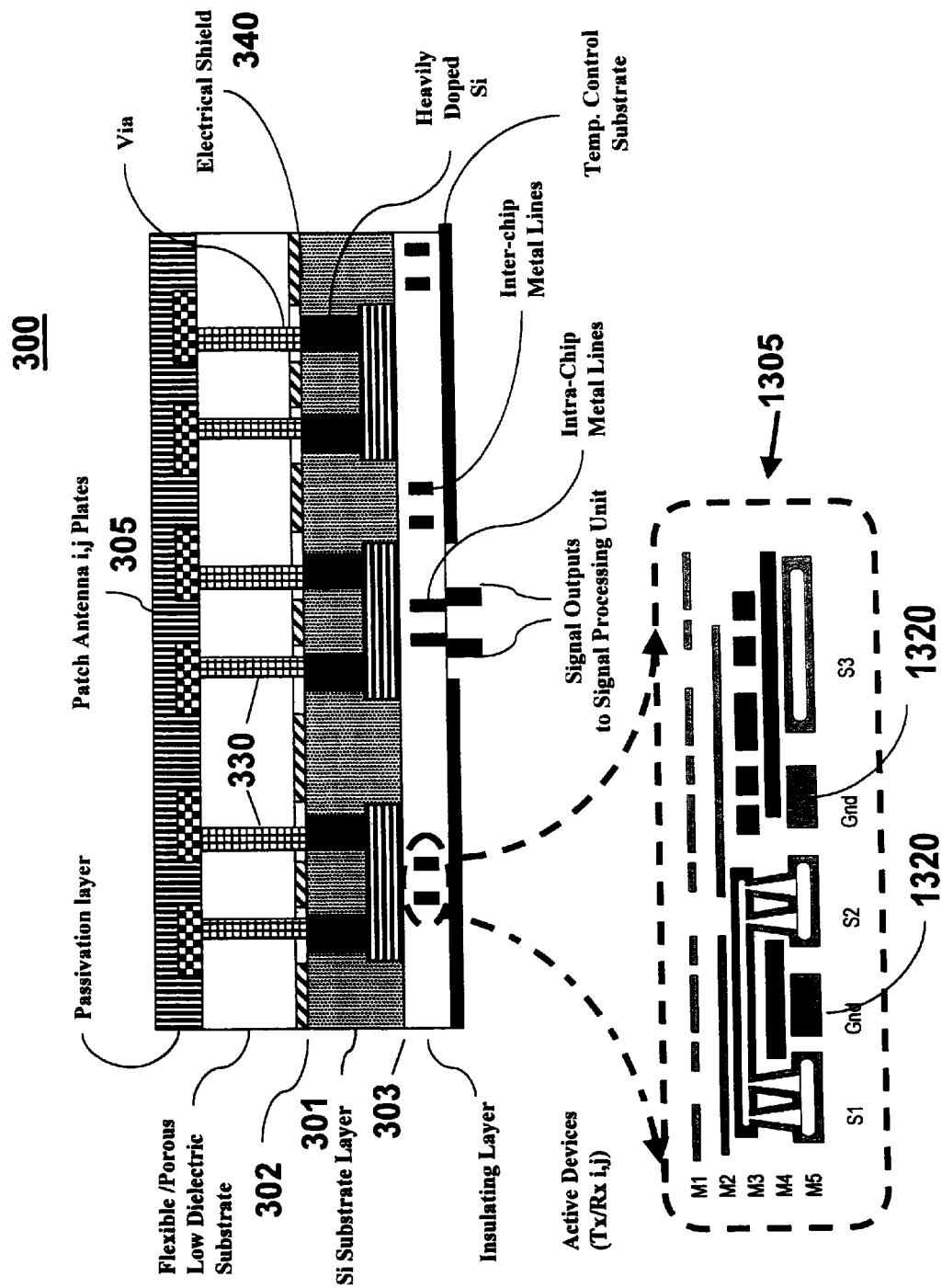
FIG. 13 is a cross sectional view of an integrated antenna circuit having a coplanar waveguide RF feed network in accordance with an embodiment of the invention.
Figure 14:
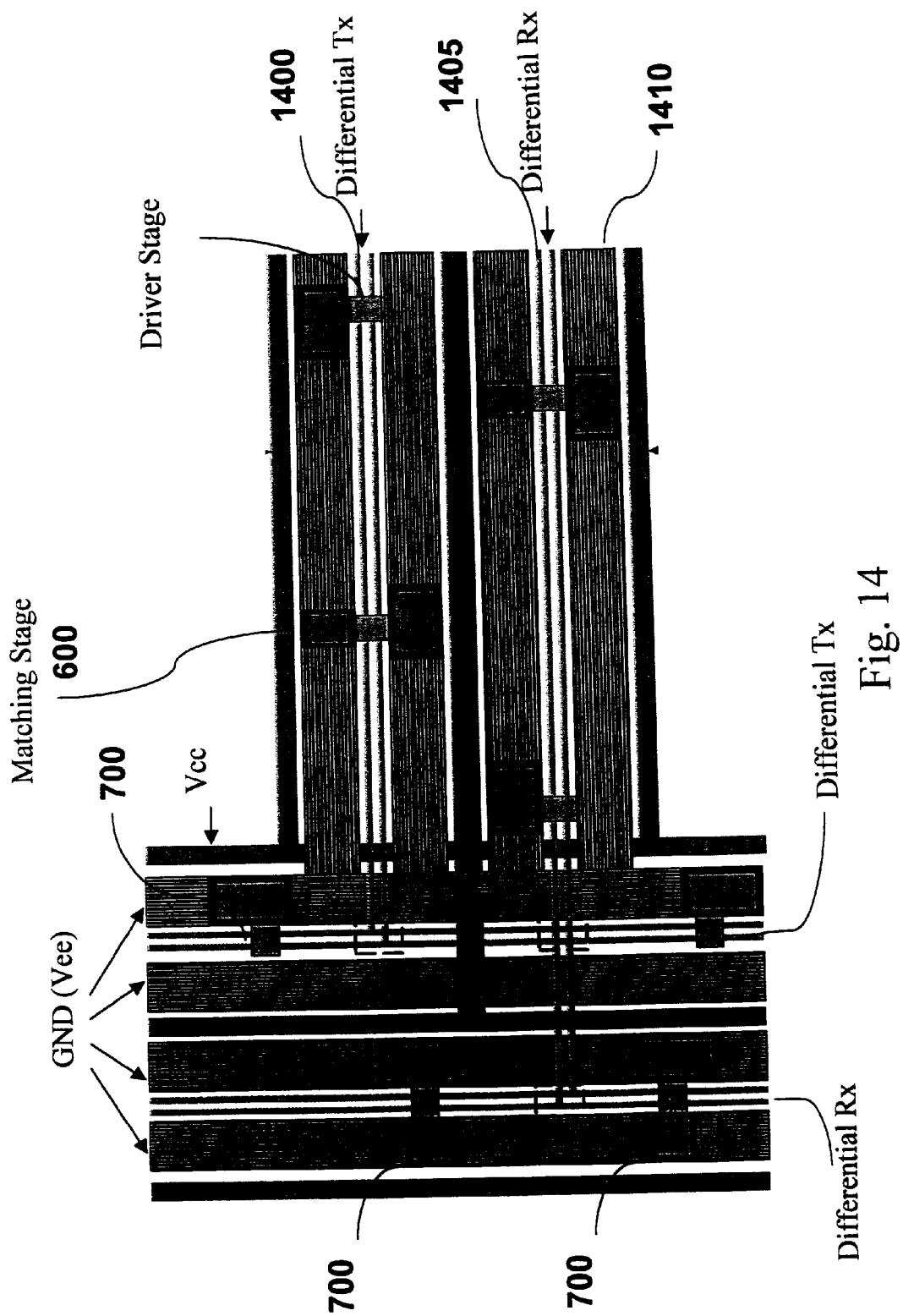
FIG. 14 is a plan view of a portion of the coplanar waveguide RF feed network of FIG. 13.

A layout view for a section of RF feed network with respect towards surface 303 of substrate 301 of FIG. 13 is illustrated in FIG. 14. In this embodiment, the RF feed network is differential having separate differential transmission coplanar waveguides 1400 and differential receiving coplanar waveguides 1405. For enhanced process quality, the corresponding ground plates 1410 for the waveguides are formed from separate conductive lines rather than solid plates. Driver amplifiers 700 and matching amplifiers 600 are integrated into the substrate (not illustrated) and couple through vias (not illustrated) to the ground plate and the waveguides.

It will be appreciated that both driving amplifiers and the matching amplifiers may be constructed using alternative arrangements of bipolar transistors such as PNP bipolar transistors or field effect transistors. Moreover, the RF feed network and these amplifiers may be constructed in either a single ended or differential fashion. DC and control lines may be arranged orthogonally to the RF distribution direction for isolation. In addition, this same orthogonality may be maintained for the RF transmit and receive networks in a full duplex design. It will thus be obvious to those skilled in the art that various changes and modifications may be made without departing from this invention in its broader aspects. The appended claims encompass all such changes and modifications as fall within the true spirit and scope of this invention.

I claim:

1. An integrated circuit antenna array, comprising:
   a substrate,
   a plurality of antennas adjacent the substrate; and
   an RF feed network adjacent the substrate for transmitting RF signals to the plurality of antennas and for receiving RF signals from the plurality of antennas, the RF feed network coupling to a distributed plurality of amplifiers integrated with the substrate for amplifying the RF signals propagated through the RF feed network wherein the antennas arrays are adjacent a first surface of the substrate and wherein the RF feed network is a co-planar waveguide network adjacent an opposing surface of the substrate, the distributed plurality of amplifiers being integrated into the opposing surface.

2. The integrated circuit antenna array of claim 1, wherein the substrate is a semiconductor wafer substrate.

3. The integrated circuit antenna array of claim 1, wherein the co-planar waveguide network is formed in metal layers adjacent the opposing surface of the substrate.

4. The integrated circuit antenna array of claim 3, wherein the co-planar waveguide comprises a transmitting co-planar waveguide for transmitting RF signals to the plurality of antennas and a receiving co-planar waveguide for receiving RF signals from the plurality of antennas.

5. An integrated RF reception network, comprising:
   a substrate,
   a plurality of antennas adjacent to the substrate; and
   an RF feed network adjacent the substrate for receiving RF signals from the plurality of antennas, the RF feed network including a combining junction coupling a plurality of conductors in the RF feed network to a single conductor, the substrate including a plurality of amplifiers corresponding to the plurality of conductors at the combining junction, each amplifier including a bipolar transistor having a common collector coupled to the combining junction.

6. The integrated RF reception network of claim 5, wherein each bipolar transistor is an NPN bipolar transistor.

7. The integrated RF reception network of claim 5, wherein the conductors are coplanar waveguide conductors driven by the plurality of amplifiers.

8. An antenna array, comprising:
   a semiconductor substrate having a first surface and an opposing second surface;
   a plurality of heavily-doped contact regions extending from the first surface to the second surface;
   a plurality of antennas formed on an insulating layer adjacent the first surface, each antenna being coupled to corresponding ones of the contact regions by vias; and
   a conductor-based RF feed network adjacent the second surface for transmitting RF signals to the plurality of antennas and for receiving RF signals from the plurality of antennas, the RF feed network coupling to a distributed plurality of amplifiers integrated into the second surface of the substrate for amplifying the RF signals propagated through the RF feed network.

9. The antenna array of claim 8, wherein the RF feed network is segmented into transmission line segment pairs, each transmission line segment pair having a first segment of length TL1 and a second segment of length TL2, the distributed amplifiers being organized into driving amplifiers and matching amplifiers, each segment corresponding to a driving amplifier and matching amplifier pair, wherein for each segment the corresponding driving amplifier drives RF signal through the segment to the corresponding matching amplifier.

10. The antenna array of claim 9, wherein the lengths TL1 and TL2 are chosen to maximize gain at a desired operating frequency.

11. The antenna array of claim 8, wherein the RF feed network comprises a first network for transmission of RF signals to the plurality of antennas and a second network for reception of RF signals from the plurality of antennas, the first and second network being arranged substantially orthogonal to each other.

* * * * *